United States Patent
Lee et al.

(10) Patent No.: US 10,099,837 B2
(45) Date of Patent: Oct. 16, 2018

(54) FOOD CONTAINER HAVING SI-DLC LAYER AND MANUFACTURING METHOD THEREOF

(71) Applicants: CJ CHEILJEDANG CORPORATION, Seoul (KR); KOREA INSTITUTE OF SCIENCE AND TECHNOLOGY, Seoul (KR)

(72) Inventors: Kwang Ryeol Lee, Seoul (KR); Myoung Woon Moon, Seoul (KR); Seong Jin Kim, Anseong-si (KR); Eun Kyung Song, Goyang-si (KR); Kyoung Sik Jo, Seoul (KR); Tae Kyung Yun, Seoul (KR)

(73) Assignees: CJ CHEILJEDANG CORPORATION, Seoul (KR); KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 935 days.

(21) Appl. No.: 14/383,059

(22) PCT Filed: Mar. 11, 2013

(86) PCT No.: PCT/KR2013/001924
§ 371 (c)(1),
(2) Date: Sep. 4, 2014

(87) PCT Pub. No.: WO2013/137602
PCT Pub. Date: Sep. 19, 2013

(65) Prior Publication Data
US 2015/0203270 A1 Jul. 23, 2015

(30) Foreign Application Priority Data
Mar. 13, 2012 (KR) .......................... 10-2012-0025472

(51) Int. Cl.
*B65D 81/24* (2006.01)
*B65D 81/30* (2006.01)
(Continued)

(52) U.S. Cl.
CPC ............. *B65D 81/24* (2013.01); *B65D 25/14* (2013.01); *B65D 25/34* (2013.01); *B65D 81/30* (2013.01);
(Continued)

(58) Field of Classification Search
CPC ........ B65D 25/14; B65D 25/34; B65D 81/24; B65D 81/30; C23C 16/0272; C23C 16/26;
(Continued)

(56) References Cited

U.S. PATENT DOCUMENTS 5,853,833 A * 12/1998 Sudo .................... B32B 1/02
220/62.22
9,617,654 B2 * 4/2017 Rajagopalan ......... C23C 28/044
(Continued)

FOREIGN PATENT DOCUMENTS

| CN | 1656247 A | 8/2005 |
| CN | 101184669 A | 5/2008 |

(Continued)

OTHER PUBLICATIONS

Chinese Office Action dated Jun. 19, 2015, issued to Chinese Application No. 201380013488.5.
(Continued)

*Primary Examiner* — Walter Aughenbaugh
(74) *Attorney, Agent, or Firm* — Stein IP, LLC

(57) ABSTRACT

There are provided a food container having a silicon incorporated diamond like carbon (Si-DLC) layer and a method thereof. The food container includes a container made of a plastic material; an intermediate thin layer formed on a
(Continued)

surface of the container; and a Si-DLC layer formed on the intermediate thin layer. Accordingly, it is possible to provide porous plastic container having a Si-DLC layer and a manufacturing method thereof, which can implement high oxygen barrier properties and excellent mechanical characteristics by stably depositing a Si-DLC layer on a food container having lower surface energy without breaking the Si-DLC layer.

8 Claims, 1 Drawing Sheet

(51) Int. Cl.
| | |
|---|---|
| *C23C 16/27* | (2006.01) |
| *B65D 25/34* | (2006.01) |
| *B65D 25/14* | (2006.01) |
| *C23C 16/26* | (2006.01) |
| *C08J 7/04* | (2006.01) |
| *C23C 16/02* | (2006.01) |

(52) U.S. Cl.
CPC .......... *C08J 7/042* (2013.01); *C23C 16/0254* (2013.01); *C23C 16/0272* (2013.01); *C23C 16/26* (2013.01); *C23C 16/27* (2013.01); *C23C 16/276* (2013.01); *C23C 16/277* (2013.01); *C23C 16/278* (2013.01); *C23C 16/279* (2013.01); *C08J 2323/12* (2013.01); *C08J 2483/02* (2013.01); *Y10T 428/1317* (2015.01); *Y10T 428/1321* (2015.01); *Y10T 428/1352* (2015.01); *Y10T 428/1379* (2015.01); *Y10T 428/1383* (2015.01)

(58) Field of Classification Search
CPC ..... C23C 16/27; C23C 16/276; C23C 16/277; C23C 16/278; C23C 16/279; C08J 7/042; Y10T 428/1317; Y10T 428/1321; Y10T 428/1352; Y10T 428/1379; Y10T 428/1383

See application file for complete search history.

(56) References Cited

U.S. PATENT DOCUMENTS

| | | | |
|---|---|---|---|
| 2007/0157885 A1 | 7/2007 | Yamasaki | 118/723 E |
| 2009/0202762 A1 | 8/2009 | Yamada et al. | 428/35.7 |
| 2012/0205279 A1 | 8/2012 | Mishima et al. | 206/524.6 |
| 2013/0280457 A1 | 10/2013 | Extrand et al. | 428/36.6 |

FOREIGN PATENT DOCUMENTS

| | | |
|---|---|---|
| CN | 101511583 A | 8/2009 |
| CN | 101568490 A | 10/2009 |
| JP | 2005-132416 A | 5/2005 |
| JP | 2006-027712 A | 2/2006 |
| JP | 2006-82816 A | 3/2006 |
| JP | 2006-089073 A | 4/2006 |
| JP | 2007-261077 A | 10/2007 |

OTHER PUBLICATIONS

Korean Office Action dated Jun. 22, 2015, issued to Korean Application No. 10-2012-0025472.

N. Inagaki et al., Preparation of Oxygen Gas Barrier Polyproylene Films by Deposition of SiOx Films Plasma-Polymerized from Mixture of Tetramethoxysilane and Oxygen, Journal of Applied Polymer Science, vol. 78, pp. 2389-2397, Mar. 2000.

D.S. Finch et al., Diamond-like Carbon, a barrier Coating for Polymers used in Packaging Applications, Packaging Technology and Science, vol. 9, pp. 73-85, (1996).

International Search Report dated Jun. 2, 2013, issued to International Patent Application No. PCT/KR2013/001924.

\* cited by examiner

FOOD CONTAINER HAVING SI-DLC LAYER AND MANUFACTURING METHOD THEREOF

CROSS-REFERENCE TO RELATED APPLICATIONS

This application is a national stage of International Application No. PCT/KR2013/001924, filed Mar. 11, 2013, which claims the benefit of Korean Application No. 10-2012-0025472, filed Mar. 13, 2012, in the Korean Intellectual Property Office. All disclosures of the document(s) named above are incorporated herein by reference.

BACKGROUND OF THE INVENTION

1. Field of the Invention

An aspect of the present invention relates to a food container having a silicon incorporated diamond like carbon (Si-DLC) layer and a manufacturing method thereof. More particularly, an aspect of the present invention relates to a food container having a Si-incorporated diamond like carbon (Si-DLC) layer and a manufacturing method thereof, which can implement high oxygen barrier properties and excellent mechanical characteristics by stably depositing a Si-DLC layer on a porous plastic container having lower surface energy without breaking the Si-DLC layer.

2. Description of the Related Art

In order to keep perishable foods for a long period of time, it is very important to provide oxygen barrier performance to food containers.

Plastic food containers have advantages of low cost of production and easiness of mass production, but have a disadvantage that oxygen barrier properties are remarkably lowered by a porous structure that is a unique feature of plastic.

In order to solve such a disadvantage, a technique for coating a thin layer on a plastic food container using a plasma method has been studied.

A diamond like carbon (DLC) layer has not only high oxygen barrier properties but also excellent mechanical characteristics (friction resistance and abrasion resistance). Hence, studies on the DLC have been conducted for a long period of time.

However, the high stress energy of the DLC layer allows a material having the DLC layer coated thereon to be limited to only plastic having a relatively high surface energy (0.031 to 0.047 N/m, Accu dyne test), such as polyethylene terephthalate (PET). In other words, the DLC layer is not stably adhered to plastic having a low surface energy (0.023 to 0.038 N/m, Accu dyne test), such as polypropylene (PP), and therefore, high oxygen barrier properties cannot be obtained.

From this point of view, it is known that properties of the PP that is more porous than the PET also have influence on the DLC layer [Reference document: N. Inagaki, et al., Journal of Applied Polymer Science 78 (2000) 2389-2397].

Consequently, while the PET has a property that as the thickness of a thin layer deposited on a surface of the PET is increased, oxygen barrier properties are increased, the PP has a property that although the thickness of a thin layer deposited on a surface of the PP is increased, oxygen barrier properties are not improved [Reference document: D. S. Finch, et al., Packaging Technology and Science 9 (1996) 73-85].

This is because the thin layer deposited on the surface of the PP is not well adhered to the surface of the PP due to its low surface energy and porous structure, but is taken off or broken.

For this reason, products to which the oxygen barrier properties are added by coating a thin layer on the PP using a plasma method could not be produced. However, the PP has advantages such as price competitiveness, thermal resistance and stability against endocrine disrupting chemicals as compared with other plastic materials. Hence, when the PP having the oxygen barrier properties is applied to food containers, it is expected that the PP will have a great economic value.

SUMMARY OF THE INVENTION

Technical Problem

Accordingly, an object of the present invention is to provide a food container having a silicon incorporated diamond like carbon (Si-DLC) layer and a, manufacturing method thereof, which can implement high oxygen barrier properties and excellent mechanical characteristics by stably depositing a Si-DLC layer on a porous plastic container having lower surface energy without breaking the Si-DLC layer.

Technical Solution

According to an aspect of the present invention, there is provided a food container having a silicon incorporated diamond like carbon (Si-DLC) layer, including: a container made of a plastic material; an intermediate thin layer formed on a surface of the container; and a Si-DLC layer formed on the intermediate thin layer.

A plasma pretreatment may be performed on the surface of the container so as to improve the adhesion between the surface of the container and the intermediate thin layer.

The container may be formed of polypropylene (PP).

The intermediate thin layer may be formed of silicon (Si).

According to another aspect of the present invention, there is provided a manufacturing method of a food container having a Si-DLC layer, the method including the steps of: preparing a container made of a plastic material; performing a plasma treatment on a surface of the container; depositing an intermediate thin layer on the surface of the container; and depositing a Si-DLC layer on the intermediate thin layer.

In the step of performing of the plasma treatment, the plasma treatment may be performed using argon (Ar).

The container may be formed of PP.

The intermediate thin layer may be formed of Si.

The step of depositing the intermediate thin layer and the step of depositing the Si-DLC layer may be performed through plasma chemical vapor deposition.

Advantageous Effects

As described above, according to the present invention, it is possible to provide a food container having a silicon incorporated diamond like carbon (Si-DLC) layer and a manufacturing method thereof, which can implement high oxygen barrier properties and excellent mechanical characteristics by stably depositing a Si-DLC layer on a porous plastic container having lower surface energy without breaking the Si-DLC layer.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
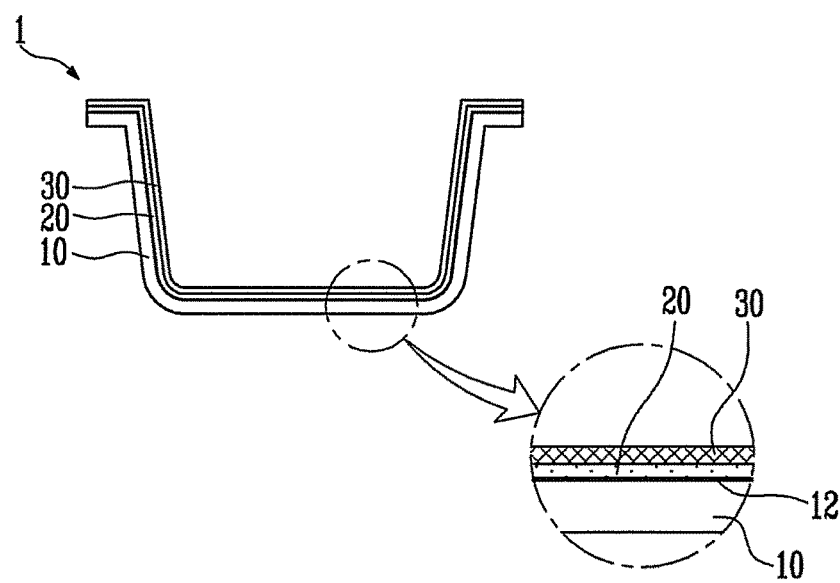
FIG. 1 is a view showing a food container according to an embodiment of the present invention.

Hereinafter, preferred embodiments of the present invention will be described in detail with reference to the accompanying drawings. However, the present invention is not limited to the embodiments but may be implemented into different forms. These embodiments are provided only for illustrative purposes and for full understanding of the scope of the present invention by those skilled in the art. Throughout the drawings, like elements are designated by like reference numerals.

Hereinafter, a food container having a silicon incorporated diamond like carbon (Si-DLC) layer and a manufacturing method thereof according to embodiments of the present invention will be described with reference to the accompanying drawings.

FIG. 1 is a view showing a food container according to an embodiment of the present invention. Particularly, FIG. 1 shows a sectional view of the food container for convenience of illustration.

Referring to FIG. 1, the food container 1 having a Si-DLC (hereinafter, referred to as the 'food container') according to the embodiment of the present invention includes a container 10, an intermediate thin layer 20 and a Si-DLC layer 30.

The container 10 may have a predetermined accommodation space in which foods are contained, and is formed of a plastic material.

The container 10 is preferably formed of a material such as polypropylene (PP), which has low surface energy and is porous, but may be formed of another plastic material which has a lower surface energy and is more porous than the PP. The container 10 may also be formed of a plastic material such as polyethylene terephthalate (PET), which has high surface energy.

The intermediate thin layer 20 is formed on a surface of the container 10 so that the Si-DLC layer 30 is stably adhered to the surface 12 of the container 10. Therefore, the intermediate thin layer 20 may be interposed between the container 10 and the Si-DLC layer 30.

In order to implement excellent oxygen barrier properties, it is not preferable that the Si-DLC layer 30 is formed directly on the container 10 made of the material such as the PP. This is because the Si-DLC layer 30 is not stably adhered to the container 10 due to the low surface energy and porous structure of the PP, and therefore, a breakdown phenomenon or the like occurs.

The intermediate thin layer 20 is preferably formed of silicon (Si) that is well adhered to the PP and has excellent chemical compatibility with Si-DLC.

In case where the intermediate thin layer 20 is formed of another material such as plasma polymerized HMDSO (pp-HMDSO), the chemical compatibility of the intermediate thin layer 20 with the Si-DLC layer 30 is lowered, and therefore, the Si-DLC thin layer 30 may be easily taken off or broken. Accordingly, the oxygen barrier properties may be lowered.

Preferably, the surface 12 of the container 10 is chemically changed so that the intermediate thin layer 20 made of the Si is stably formed on the container 10 made of the PP.

The Si-DLC thin layer 30 is formed on the intermediate thin layer 20. The Si-DLC thin layer 30 is formed of Si-DLC having high oxygen barrier properties and strong mechanical properties such as friction and abrasion properties.

In this case, the content of the Si is important so that the Si-DLC thin layer 30 has high oxygen barrier properties.

When the content of the Si is appropriate, the Si functions to connect carbons (C) in the Si-DLC layer 30, thereby forming a dense thin layer. However, when the content of the Si is too high, such an effect does not occur, and therefore, the high oxygen barrier properties cannot be obtained.

When only DLC is used without containing the Si, the thin layer may be easily taken off by high stress energy of the DLC.

Figure 2:
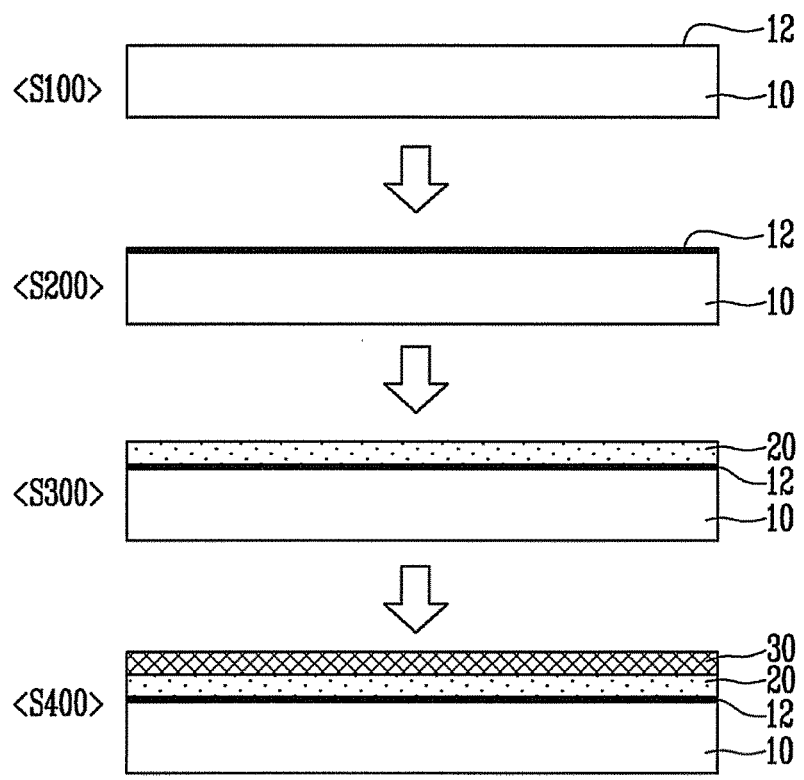
FIG. 2 is a sectional view illustrating a manufacturing method of a food container according to an embodiment of the present invention.

FIG. 2 is a sectional view illustrating a manufacturing method of a food container according to an embodiment of the present invention.

Referring to FIG. 2, the manufacturing method of the food container 1 according to the present invention includes a container preparation step (S100), a plasma pretreatment step (S200), an intermediate thin layer deposition step (S300) and a Si-DLC layer deposition step (S400).

In the container preparation step (S100), a container 10 made of a plastic material is prepared.

In this case, the container 10 is preferably formed of PP having low surface energy and large porosity. However, it is difficult that a thin layer is adhered to the PP.

Accordingly, in the plasma pretreatment step (S200), a plasma treatment may be performed on a surface 12 of the container 10 before a buffer thin layer 20 is deposited on the surface 12 of the container 10.

Specifically, the plasma pretreatment step (S200) will be described. First, the container 10 made of a PP material is placed in a chamber of a radio frequency-chemical vapor deposition (RF-CVD) apparatus (not shown), and a vacuum state is formed in the chamber through a pump or the like.

Then, argon (Ar) gas is injected into the chamber at a certain flow rate, and a plasma state is formed by applying RF-power to the chamber, thereby performing a plasma pretreatment process.

As the plasma state is formed, a self-bias voltage is generated in the chamber, and accordingly, Ar particles having energy react with the surface 12 of the container 10. Thus, high kinetic energy of the Ar particles is transferred to the surface 12 of the container 10.

Since the surface 12 of the container 10 is in a state in which the energy of the surface 12 of the container 10 is higher than balance energy, the surface 12 of the container 10 is combined with another material, so as to be in a state in which the surface 12 of the container 10 intends to decrease its energy (in a state in which the reactivity is increased).

In the plasma pretreatment step (S200), the Ar gas used in plastic surface pretreatment is preferably injected into the chamber of the RF-CVD apparatus.

The intermediate thin layer 20 made of a Si material having excellent chemical compatibility with the Si-DLC layer 30 is preferably formed on the surface 12 of the container 10. This is because the intermediate thin layer 20 made of the Si material, on which $O_2$ plasma treatment is performed, is further stably adhered to the surface 12 of the container 10 as compared with that on which Ar plasma treatment is performed.

Thus, when the Ar plasma treatment is performed on the surface 12 of the container 10 made of the PP material, the surface 12 of the container 10 has high oxygen barrier properties. On the other hand, when the $O_2$ plasma treatment is performed on the surface 12 of the container 10 made of the PP material, the intermediate thin layer 20 is easily taken off or broken, and therefore, the surface 12 of the container 10 has low oxygen barrier properties.

In the intermediate thin layer deposition step (S300), the intermediate thin layer 20 may be deposited on the surface 12 of the container 10, on which the plasma treatment is performed.

The intermediate thin layer 20 does not provide a mechanical deformation of the container 10 directly to the Si-DLC layer 30 to be deposited on the intermediate thin layer 20 but absorbs the mechanical deformation of the container 10.

The intermediate thin layer 20 is relatively well deformed due to its low Young's modulus. The intermediate thin layer 20 is preferably formed of the Si having high chemical compatibility with the Si-DLC layer 30 to be deposited on the intermediate thin layer 20.

When the intermediate thin layer 20 is formed of another material such as pp-HMDSO, the chemical compatibility of the intermediate thin layer 20 with the Si-DLC layer 30 is lowered, and therefore, the Si-DLC layer 30 may be easily taken off or broken. Accordingly, the oxygen barrier properties of the intermediate thin layer 20 are lowered.

Specifically, the intermediate thin layer deposition step (S300) will be described. After the plasma pretreatment step (S200) is performed, a plasma state is formed by injecting reactive gas (e.g., $SiH_4$ or the like) into the chamber of the RF-CVD apparatus.

The intermediate thin layer 20 made of the Si may be formed on the surface 12 of the container 10 by means of the reaction between plasma and the reactive gas such as $SiH_4$.

In the Si-DLC layer deposition step (S400), the Si-DLC layer 30 performing an oxygen blocking function may be deposited on the intermediate thin layer 20 formed in the intermediate thin layer deposition step (S300).

Specifically, the Si-DLC layer deposition step (S400) will be described. The Si-DLC layer 30 performing the oxygen blocking function may be formed on the intermediate thin layer 20 by injecting a mixed gas of $C_6H_6$ and $SiH_4$ as an appropriate flow rate into the chamber of the RF-CVD apparatus and then performing a plasma reaction.

Here, the mixed gas of $C_6H_6$ and $SiH_4$ is used as an example of the reactive gas. However, it will be apparent that another reactive gas capable of forming the Si-DLC may be used.

In this case, the content of the Si is important for the Si-DLC layer 30 to have high oxygen barrier properties.

When the Si is not contained at all in a thin layer, the thin layer may be easily taken off due to the high stress energy of DLC. When the Si is excessively contained in the thin layer, the density of the thin layer decreases, and therefore, the thin layer cannot have high oxygen barrier properties.

Consequently, through the steps described above, the thin layer made of a DLC material, which was difficult to be coated on the container 10 made of the PP material, can be stably coated on the container 10 without occurring the phenomenon that the thin layer made of the DLC material is taken off or broken. Accordingly, it is possible to implement high oxygen barrier properties.

In addition, since the Si-DLC is a material known that the Si-DLC has very excellent mechanical properties such as friction and abrasion, it can be expected that the mechanical stability of the food container 1 will be improved.

Conventionally, a method was used in which the oxygen barrier properties were improved by allowing high-priced ethylene vinyl alcohol (EVOH) to be mixed with or adhered to the PP. However, in the present invention, the EVOH is not used, so that manufacturing cost can be reduced, thereby securing price competitiveness.

In the method using the EVOH, a large amount of substance except the PP is contained in a food container, and therefore, it is difficult to recycle the food container. However, in the present invention using the plasma method, the food container can be easily recycled.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

The invention claimed is:

1. A food container having a silicon incorporated diamond like carbon (Si-DLC) layer, including:
   a container made of a plastic material;
   an intermediate layer formed on a surface of the container; and
   a Si-DLC layer formed on the intermediate layer,
   wherein a plasma pretreatment is performed on the surface of the container so as to improve the adhesion between the surface of the container and the intermediate layer.

2. The food container of claim 1, wherein the container is formed of polypropylene (PP).

3. The food container of claim 1, wherein the intermediate layer is formed of silicon (Si).

4. A manufacturing method of a food container having a Si-DLC layer, the method comprising the steps of:
   preparing a container made of a plastic material;
   performing a plasma treatment on a surface of the container;
   depositing an intermediate layer on the surface of the container; and
   depositing a Si-DLC layer on the intermediate layer.

5. The method of claim 4, wherein in the step of performing of the plasma treatment, the plasma treatment is performed using argon (Ar).

6. The method of claim 4, wherein the container may be formed of PP.

7. The method of claim 4, wherein the intermediate layer is formed of Si.

8. The method of claim 4, wherein the step of depositing the intermediate layer and the step of depositing the Si-DLC layer are performed through plasma chemical vapor deposition.

* * * * *